United States Patent
Ito et al.

(10) Patent No.: US 11,340,163 B2
(45) Date of Patent: May 24, 2022

(54) METHOD AND APPARATUS FOR DETECTING FACET REGION, WAFER PRODUCING METHOD, AND LASER PROCESSING APPARATUS

(71) Applicant: DISCO CORPORATION, Tokyo (JP)

(72) Inventors: Yusaku Ito, Tokyo (JP); Naoki Murazawa, Tokyo (JP); Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 380 days.

(21) Appl. No.: 16/675,798

(22) Filed: Nov. 6, 2019

(65) Prior Publication Data

US 2020/0150038 A1 May 14, 2020

(30) Foreign Application Priority Data

Nov. 8, 2018 (JP) .............................. JP2018-210679

(51) Int. Cl.
*H01L 21/66* (2006.01)
*G01N 21/64* (2006.01)

(52) U.S. Cl.
CPC ............. *G01N 21/64* (2013.01); *H01L 22/12* (2013.01)

(58) Field of Classification Search
None
See application file for complete search history.

(56) References Cited

U.S. PATENT DOCUMENTS

2020/0086426 A1* 3/2020 Yamamoto ............ B23K 26/364
2020/0150038 A1* 5/2020 Ito .......................... G01N 21/64

FOREIGN PATENT DOCUMENTS

| JP | 2000094221 A | 4/2000 |
|----|--------------|--------|
| JP | 2016111143 A | 6/2016 |

\* cited by examiner

*Primary Examiner* — Jack S Chen
(74) *Attorney, Agent, or Firm* — Greer Burns & Crain Ltd.

(57) ABSTRACT

A method of detecting a Facet region includes: a fluorescence luminance detecting step of detecting fluorescence luminance unique to SiC by irradiating a SiC ingot with exciting light having a predetermined wavelength from a top surface of the SiC ingot; and a coordinate setting step of setting a region in which the fluorescence luminance is equal to or higher than a predetermined value in the fluorescence luminance detecting step as a non-Facet region, setting a region in which the fluorescence luminance is lower than the predetermined value in the fluorescence luminance detecting step as a Facet region, and setting coordinates of a boundary between the Facet region and the non-Facet region.

2 Claims, 8 Drawing Sheets

| | COORDINATES |
|---|---|
| a | $x_1, y_1$ |
| b | $x_2, y_2$ |
| c | $x_3, y_3$ |
| v | $x_{22}, y_{22}$ |
| w | $x_{23}, y_{23}$ |
| x | $x_{24}, y_{24}$ |

METHOD AND APPARATUS FOR DETECTING FACET REGION, WAFER PRODUCING METHOD, AND LASER PROCESSING APPARATUS

BACKGROUND OF THE INVENTION

Field of the Invention

The present invention relates to a method and an apparatus for detecting the Facet region of a SiC ingot, a wafer producing method for producing a SiC wafer from the SiC ingot, and a laser processing apparatus for forming a peeling layer in the SiC ingot.

Description of the Related Art

Devices such as integrated circuits (ICs), large-scale integrations (LSIs), light emitting diodes (LEDs), or the like are formed by laminating a functional layer to the top surface of a wafer whose material is Si (silicon), $Al_2O_3$ (sapphire), or the like, and demarcating the devices by a plurality of planned dividing lines intersecting the functional layer. In addition, power devices, LEDs, or the like are formed by laminating a functional layer to the top surface of a wafer whose material is hexagonal single crystal SiC (silicon carbide), and demarcating the power devices, the LEDs, or the like by a plurality of planned dividing lines intersecting the functional layer. The wafer on which the devices are formed is divided into individual device chips by processing the planned dividing lines by a cutting apparatus or a laser processing apparatus. Each of the divided device chips is used in an electric apparatus such as a mobile telephone, a personal computer, or the like.

The wafer on which the devices are formed is generally produced by thinly cutting an ingot in a cylindrical shape with a wire saw. The top surface and undersurface of the cut wafer are finished into a mirror surface by polishing (see Japanese Patent Laid-Open No. 2000-94221, for example). However, when the ingot is cut by a wire saw, and the top surface and undersurface of the cut wafer are polished, a large part (70% to 80%) of the ingot is discarded, which is uneconomical. The SiC ingot, in particular, has a high hardness, and is difficult to cut with a wire saw. A considerable time is therefore taken to cut the SiC ingot with a wire saw, thus resulting in poor productivity. In addition, the unit price of the ingot is high, and there is a problem in producing the wafer efficiently.

Accordingly, the present applicant has proposed a technology that forms a peeling layer in a planned cutting plane by irradiating a SiC ingot with a laser beam having a wavelength transmissible through hexagonal single crystal SiC while positioning the focusing point of the laser beam within the SiC ingot, and peeling off a SiC wafer from the SiC ingot along the planned cutting plane in which the peeling layer is formed (see Japanese Patent Laid-Open No. 2016-111143, for example).

SUMMARY OF THE INVENTION

However, a region having a different crystal structure which region is referred to as a Facet region may be present within the SiC ingot. The Facet region has a high index of refraction and a high energy absorption rate as compared with a non-Facet region. Thus, the position and finished quality of the peeling layer formed within the SiC ingot by the application of the laser beam become nonuniform, and a level difference occurs between the Facet region and the non-Facet region in the wafer.

Accordingly, an object of the present invention is to provide a method of detecting the Facet region of a SiC ingot which method can detect the Facet region and a non-Facet region.

Another object of the present invention is to provide an apparatus for detecting the Facet region of a SiC ingot which apparatus can detect the Facet region and a non-Facet region.

Yet another object of the present invention is to provide a wafer producing method that can produce a wafer without a level difference between a Facet region and a non-Facet region.

Yet another object of the present invention is to provide a laser processing apparatus that can produce a wafer without a level difference between a Facet region and a non-Facet region.

In accordance with an aspect of the present invention, there is provided a method of detecting a Facet region of a SiC ingot, the method including: a fluorescence luminance detecting step of detecting fluorescence luminance unique to SiC by irradiating the SiC ingot with exciting light having a predetermined wavelength from a top surface of the SiC ingot; and a coordinate setting step of setting a region in which the fluorescence luminance is equal to or higher than a predetermined value in the fluorescence luminance detecting step as a non-Facet region, setting a region in which the fluorescence luminance is lower than the predetermined value in the fluorescence luminance detecting step as a Facet region, and setting coordinates of a boundary between the Facet region and the non-Facet region.

In accordance with another aspect of the present invention, there is provided a wafer producing method for producing a SiC wafer from a SiC ingot, the wafer producing method including: a flat surface forming step of forming a top surface of the SiC ingot into a flat surface by grinding the top surface of the SiC ingot; a fluorescence luminance detecting step of detecting fluorescence luminance unique to SiC by irradiating the SiC ingot with exciting light having a predetermined wavelength from the top surface of the SiC ingot; a coordinate setting step of setting, as an X-axis, a direction orthogonal to a direction in which a c-plane is inclined with respect to the top surface of the SiC ingot and an off angle is formed, setting a direction orthogonal to the X-axis as a Y-axis, setting a region in which the fluorescence luminance is equal to or higher than a predetermined value in the fluorescence luminance detecting step as a non-Facet region, setting a region in which the fluorescence luminance is lower than the predetermined value in the fluorescence luminance detecting step as a Facet region, and setting X-coordinates and Y-coordinates of a boundary between the Facet region and the non-Facet region; a processing feed step of forming a band-shaped peeling layer in which SiC is separated into Si and C and a crack extends along the c-plane, by positioning a focusing point formed by condensing a laser beam having a wavelength transmissible through SiC by a condenser at a depth corresponding to thickness of a wafer to be produced from the top surface of the SiC ingot, and processing-feeding the SiC ingot and the focusing point relative to each other in an X-axis direction while irradiating the SiC ingot with the laser beam; an indexing feed step of arranging band-shaped peeling layers in a Y-axis direction in parallel with each other by indexing-feeding the SiC ingot and the focusing point relative to each other in the Y-axis direction; and a peeling step of peeling off the wafer to be produced from the peeling layers; the processing feed step increasing energy of the laser beam and raising a position of the condenser at a time of irradiating the Facet region with the laser beam with respect to the energy of the laser beam and the position of the condenser at a time of irradiating the non-Facet region with the laser beam on a basis of the X-coordinates and the Y-coordinates of the boundary between the Facet region and the non-Facet region, the X-coordinates and the Y-coordinates being set in the coordinate setting step.

In accordance with a further aspect of the present invention, there is provided an apparatus for detecting a Facet region of a SiC ingot, the apparatus including: fluorescence luminance detecting means detecting fluorescence luminance unique to SiC by irradiating the SiC ingot with exciting light having a predetermined wavelength from a top surface of the SiC ingot; and coordinate setting means setting a region in which the fluorescence luminance detected by the fluorescence luminance detecting means is equal to or higher than a predetermined value as a non-Facet region, setting a region in which the fluorescence luminance is lower than the predetermined value as a Facet region, and setting coordinates of a boundary between the Facet region and the non-Facet region.

In accordance with a still further aspect of the present invention, there is provided a laser processing apparatus for forming a peeling layer in a SiC ingot, the laser processing apparatus including: a holding table configured to hold the SiC ingot; fluorescence luminance detecting means detecting fluorescence luminance unique to SiC by irradiating the SiC ingot with exciting light having a predetermined wavelength from a top surface of the SiC ingot; coordinate setting means setting, as an X-axis, a direction orthogonal to a direction in which a c-plane is inclined with respect to the top surface of the SiC ingot and an off angle is formed, setting a direction orthogonal to the X-axis as a Y-axis, setting a region in which the fluorescence luminance detected by the fluorescence luminance detecting means is equal to or higher than a predetermined value as a non-Facet region, setting a region in which the fluorescence luminance is lower than the predetermined value as a Facet region, and setting X-coordinates and Y-coordinates of a boundary between the Facet region and the non-Facet region; a laser beam irradiating unit including a condenser that forms a peeling layer in which SiC is separated into Si and C and a crack extends along the c-plane, by positioning a focusing point of a laser beam having a wavelength transmissible through SiC at a depth corresponding to thickness of a wafer to be produced from the top surface of the SiC ingot, and irradiating the SiC ingot with the laser beam; an X-axis feeding mechanism configured to processing-feed the holding table and the condenser relative to each other in an X-axis direction; a Y-axis feeding mechanism configured to indexing-feed the holding table and the condenser relative to each other in a Y-axis direction; and a control unit configured to increase energy of the laser beam and raise a position of the condenser at a time of irradiating the Facet region with the laser beam with respect to the energy of the laser beam and the position of the condenser at a time of irradiating the non-Facet region with the laser beam on a basis of the X-coordinates and Y-coordinates of the boundary between the Facet region and the non-Facet region.

According to the Facet region detecting method in accordance with the present invention, the boundary between the Facet region and the non-Facet region can be detected. Hence, on the basis of data on the detected Facet region and the detected non-Facet region, processing conditions for irradiating the SiC ingot with the laser beam can be controlled appropriately, so that the wafer without a level difference between the Facet region and the non-Facet region can be produced.

According to the wafer producing method in accordance with the present invention, the position and finished quality of the peeling layer formed in the Facet region and the non-Facet region become uniform, so that the wafer without a level difference between the Facet region and the non-Facet region can be produced.

According to the Facet region detecting apparatus in accordance with the present invention, processing conditions for irradiating the SiC ingot with the laser beam can be controlled appropriately on the basis of data on the detected Facet region and the detected non-Facet region, so that the wafer without a level difference between the Facet region and the non-Facet region can be produced.

According to the laser processing apparatus in accordance with the present invention, the position and finished quality of the peeling layer formed in the Facet region and the non-Facet region become uniform, so that the wafer without a level difference between the Facet region and the non-Facet region can be produced.

The above and other objects, features and advantages of the present invention and the manner of realizing them will become more apparent, and the invention itself will best be understood from a study of the following description and appended claims with reference to the attached drawings depicting some preferred embodiments of the invention.

DETAILED DESCRIPTION OF THE PREFERRED EMBODIMENTS

Preferred embodiments of a method and an apparatus for detecting a Facet region, a wafer producing method, and a laser processing apparatus according to the present invention will hereinafter be described with reference to the drawings.

A laser processing apparatus according to an embodiment of the present invention will first be described with reference to FIG. 1. The laser processing apparatus indicated in entirety by reference numeral 2 is constituted at least of: a holding unit 4 that holds a SiC ingot; fluorescence luminance detecting means 6 irradiating the SiC ingot with exciting light of a predetermined wavelength from the top surface of the SiC ingot and detecting fluorescence luminance unique to SiC; coordinate setting means 8 setting a region in which the fluorescence luminance detected by the fluorescence luminance detecting means 6 is equal to or higher than a predetermined value as a non-Facet region, setting a region in which the fluorescence luminance is lower than the predetermined value as a Facet region, and setting the X-coordinates and Y-coordinates of a boundary between the Facet region and the non-Facet region; a laser beam irradiating unit 12 including a condenser 10 that forms a peeling layer in which SiC is separated into Si and C and cracks extend along a c-plane, by positioning a focusing point of a laser beam having a wavelength transmissible through SiC at a depth corresponding to the thickness of a wafer to be produced from the top surface of the SiC ingot, and irradiating the SiC ingot with a laser beam; an X-axis feeding mechanism 14 that processing-feeds the holding unit 4 and the condenser 10 relative to each other in an X-axis direction; a Y-axis feeding mechanism 16 that indexing-feeds the holding unit 4 and the condenser 10 relative to each other in a Y-axis direction; and a control unit 18 that controls the operation of the laser processing apparatus 2. Incidentally, the X-axis direction is a direction indicated by an arrow X in FIG. 1, and the Y-axis direction is a direction indicated by an arrow Y in FIG. 1 and is a direction orthogonal to the X-axis direction. In addition, a plane defined by the X-axis direction and the Y-axis direction is substantially horizontal.

Figure 1:
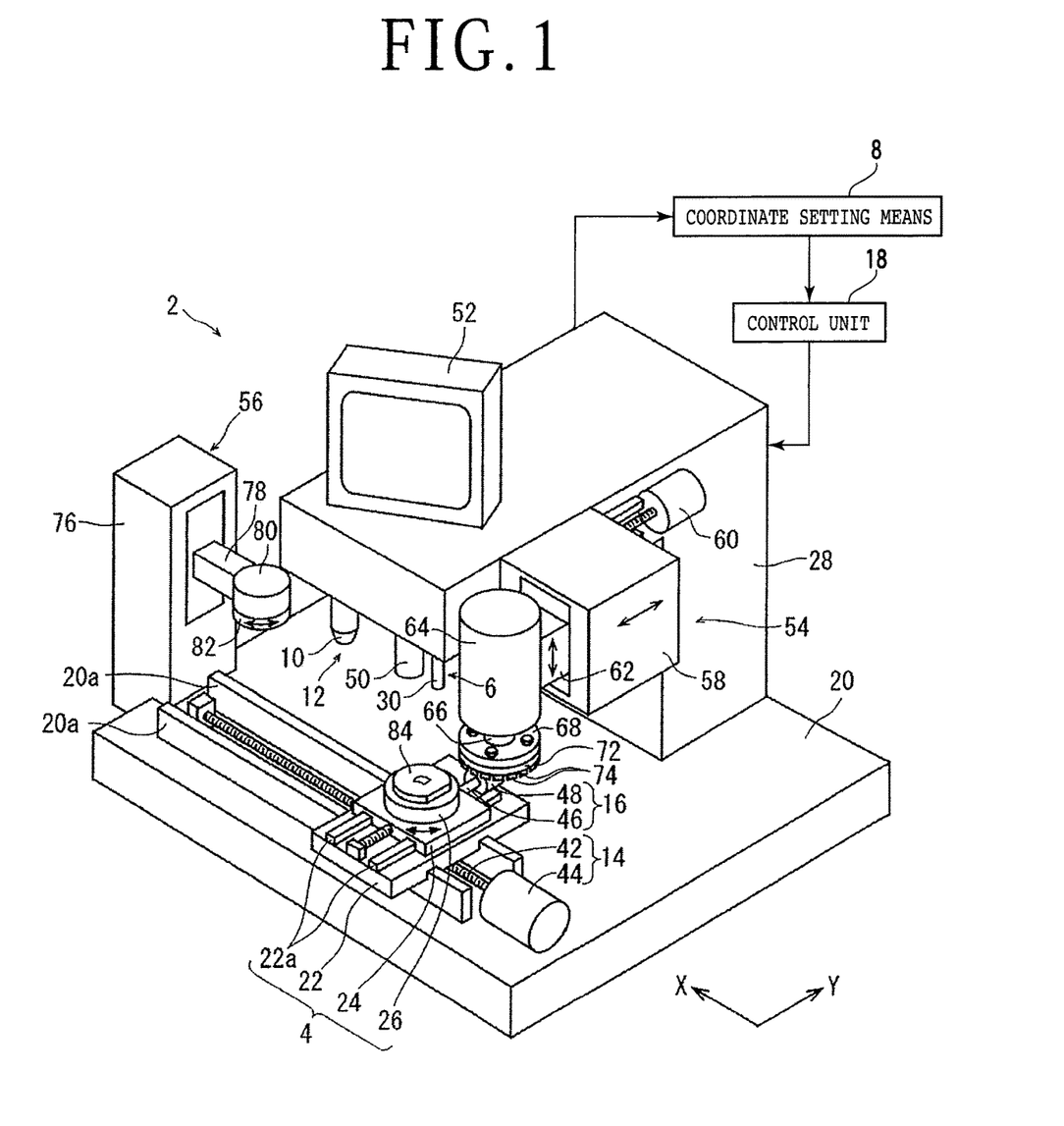
FIG. 1 is a perspective view of a laser processing apparatus according to an embodiment of the present invention.

As depicted in FIG. 1, the holding unit 4 includes: an X-axis movable plate 22 mounted on a base 20 so as to be movable in the X-axis direction; a Y-axis movable plate 24 mounted on the X-axis movable plate 22 so as to be movable in the Y-axis direction; a holding table 26 rotatably mounted on the top surface of the Y-axis movable plate 24; and a holding table motor (not depicted) that rotates the holding table 26.

The fluorescence luminance detecting means 6 will be described with reference to FIG. 1 and FIG. 2. The fluorescence luminance detecting means 6 according to the present embodiment is provided to a frame body 28 that extends upward from the top surface of the base 20 and next extends substantially horizontally. The fluorescence luminance detecting means 6 includes a case 30 fitted to an undersurface of an end of the frame body 28. In addition, as depicted in FIG. 2, the fluorescence luminance detecting means 6 includes: a light source 32 that oscillates exciting light EL having a low power (for example, 0.1 W) at such a level that laser processing is not performed on the SiC ingot, and having a predetermined wavelength (for example, 370 nm); a dichroic mirror 34 that reflects the exciting light EL having the predetermined wavelength which exciting light is oscillated from the light source 32 and transmits light having a wavelength outside a first predetermined wavelength range (for example, 365 to 375 nm) including the above-described predetermined wavelength; a condensing lens 36 that condenses the exciting light EL reflected by the dichroic mirror 34 and irradiates the SiC ingot with the condensed exciting light EL; a band-pass filter 38 that transmits light in a second predetermined wavelength range (for example, 395 to 430 nm); and a photodetector 40 that detects the luminance of the light transmitted by the band-pass filter 38.

Figure 2:
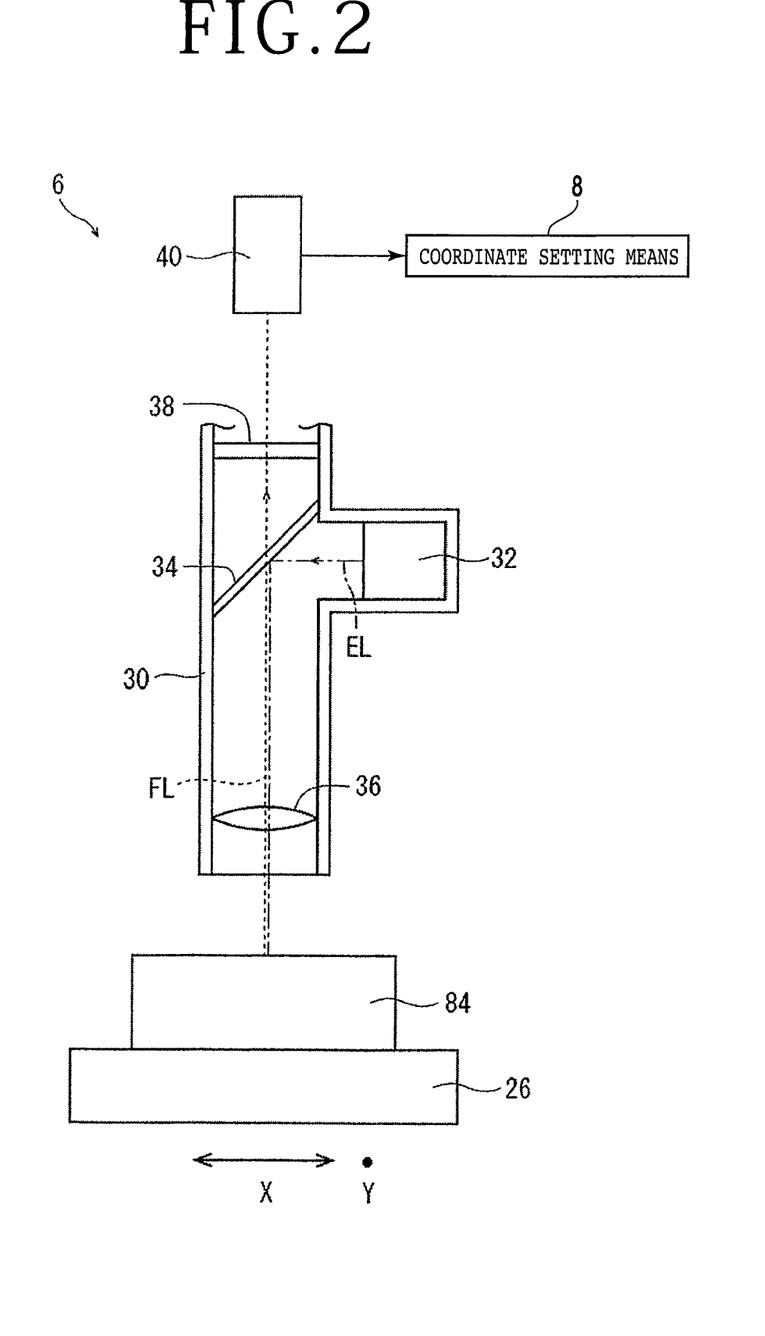
FIG. 2 is a schematic diagram of fluorescence luminance detecting means depicted in FIG. 1.

In the present embodiment, as depicted in FIG. 2, the light source 32, the dichroic mirror 34, the condensing lens 36, and the band-pass filter 38 are arranged within the case 30. In addition, though not depicted, the fluorescence luminance detecting means 6 includes focusing point position adjusting means adjusting the vertical position of the focusing point of the exciting light EL by raising or lowering the case 30. The focusing point position adjusting means can be constituted of a ball screw coupled to the case 30 and extending in a vertical direction and a motor for rotating the ball screw.

The exciting light EL emitted from the light source 32 is reflected by the dichroic mirror 34, guided to the condensing lens 36, condensed in the condensing lens 36, and applied to the SiC ingot. When the exciting light EL is applied to the SiC ingot, fluorescence (radiated light) FL including a wavelength (for example, approximately 410 nm) different from the wavelength of the exciting light EL is emitted from the SiC ingot. The fluorescence FL passes through the condensing lens 36 and the dichroic mirror 34. Only the fluorescence FL in the second predetermined wavelength range thereafter passes through the band-pass filter 38. The luminance of the fluorescence FL passed through the band-pass filter 38 is detected by the photodetector 40. The fluorescence luminance detecting means 6 detects the luminance of the fluorescence FL unique to SiC on the entire top surface of the SiC ingot by irradiating the SiC ingot with the exciting light EL having the predetermined wavelength from the top surface of the SiC ingot while the SiC ingot and the case 30 are moved relative to each other.

As depicted in FIG. 2, the coordinate setting means 8 is electrically connected to the photodetector 40 of the fluorescence luminance detecting means 6. Data on the fluorescence luminance of each part of the SiC ingot which fluorescence luminance is detected by the photodetector 40 is input to the coordinate setting means 8. Then, the coordinate setting means 8 sets, as an X-axis, a direction orthogonal to a direction in which the c-plane is inclined with respect to the top surface of the SiC ingot and an off angle is formed, sets a direction orthogonal to the X-axis as a Y-axis, sets, as a non-Facet region, a region in which the fluorescence luminance detected by the fluorescence luminance detecting means 6 is equal to or higher than the predetermined value, sets a region in which the fluorescence luminance is lower than the predetermined value as a Facet region, and sets the X-coordinates and Y-coordinates of a boundary between the Facet region and the non-Facet region. Incidentally, the X-axis and the Y-axis used by the coordinate setting means 8 are substantially identical to the above-described X-axis direction and the above-described Y-axis direction depicted in FIG. 1.

Figure 3:
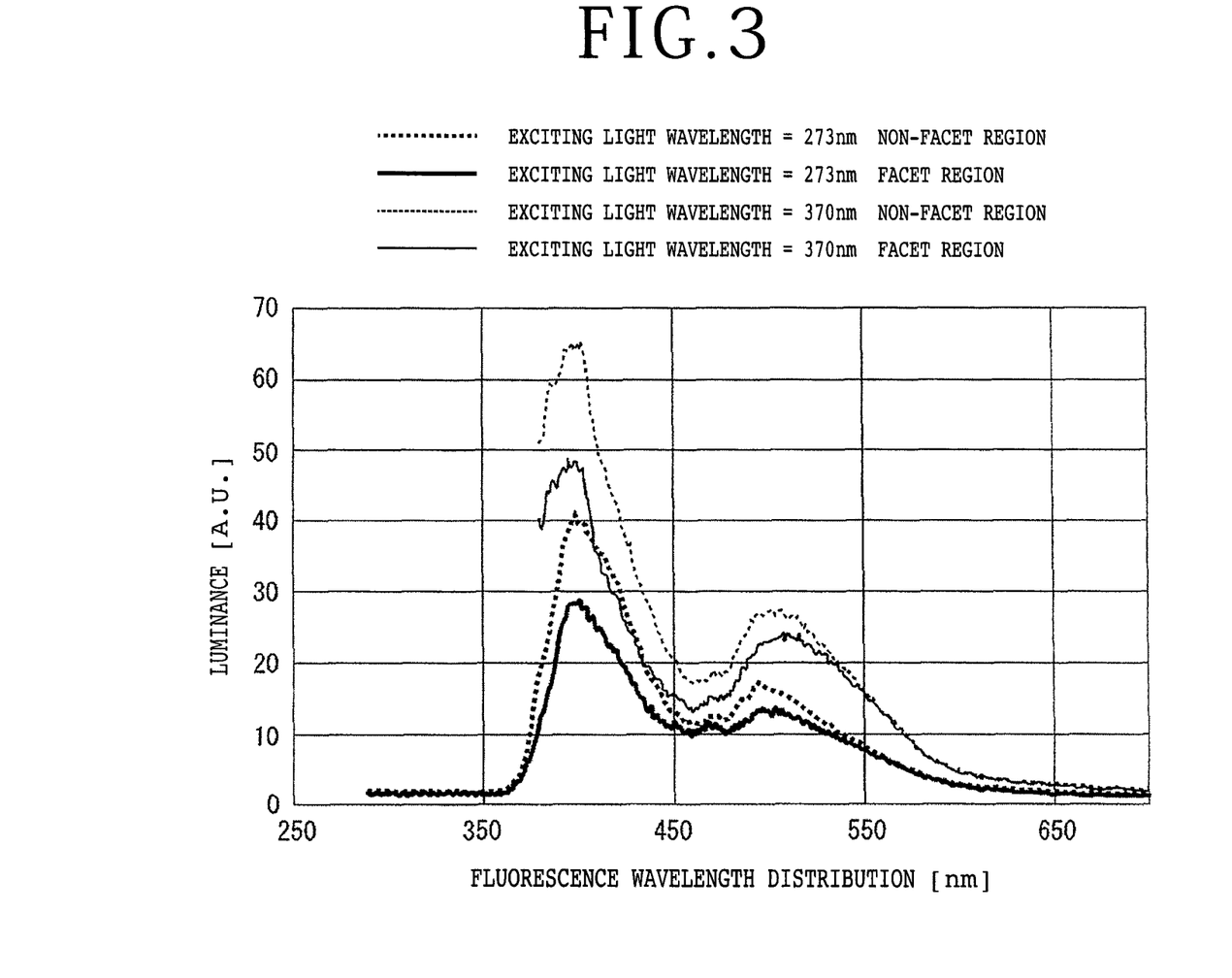
FIG. 3 is a graph depicting relation between fluorescence wavelengths of a Facet region and a non-Facet region and luminance in cases where the wavelength of exciting light is 370 nm and 273 nm.

Here, description will be made of the predetermined value of the luminance as a determination criterion for the coordinate setting means 8 to distinguish between the Facet region and the non-Facet region. When the SiC ingot is irradiated with light having a wavelength of 370 nm or a wavelength of 273 nm as the exciting light EL, a luminance peak value appears in the vicinity of 410 nm in the wavelengths of the fluorescence FL emitted from the SiC ingot at either wavelength, as depicted in FIG. 3. On the other hand, as is understood by reference to FIG. 3, luminance peak values of the Facet region and the non-Facet region in the case where the wavelength of the exciting light EL is 370 nm are different from luminance peak values of the Facet region and the non-Facet region in the case where the wavelength of the exciting light EL is 273 nm. Hence, the predetermined value of the luminance as a determination criterion for distinguishing between the Facet region and the non-Facet region is set so as to be between the luminance peak value of the Facet region and the luminance peak value of the non-Facet region according to the wavelength of the exciting light EL. It suffices for the predetermined value to be about an intermediate value between the luminance peak value of the Facet region and the luminance peak value of the non-Facet region. In the case where the wavelength of the exciting light EL is 370 nm, for example, the luminance peak value of the Facet region is approximately 48 A. U. (see a thin solid line in FIG. 3), and the luminance peak value of the non-Facet region is approximately 65 A. U. (see a thin dotted line in FIG. 3). Thus, the predetermined value can be set to approximately 55 to 58 A. U. In addition, in the case where the wavelength of the exciting light EL is 273 nm, the luminance peak value of the Facet region is approximately 28 A. U. (see a thick solid line in FIG. 3), and the luminance peak value of the non-Facet region is approximately 40 A. U. (see a thick dotted line in FIG. 3). Thus, the predetermined value can be set to approximately 33 to 35 A. U.

As depicted in FIG. 1, the condenser 10 of the laser beam irradiating unit 12 is fitted to the undersurface of the end of the frame body 28 at an interval in the X-axis direction from the case 30 of the fluorescence luminance detecting means 6. In addition, though not depicted, the laser beam irradiating unit 12 includes: a laser oscillator that oscillates a pulsed laser having a wavelength transmissible through SiC; an attenuator that adjusts the power of the pulsed laser beam emitted from the laser oscillator; and focusing point position adjusting means adjusting the vertical position of the focusing point of the pulsed laser beam by raising or lowering the condenser 10. It suffices for the focusing point position adjusting means to have a configuration including a ball screw coupled to the condenser 10 and extending in the vertical direction and a motor that rotates the ball screw.

In the laser beam irradiating unit 12, the condenser 10 is raised or lowered by the focusing point position adjusting means to position the focusing point of the pulsed laser beam having the wavelength transmissible through SiC at a depth corresponding to the thickness of a wafer to be produced from the top surface of the SiC ingot held by the holding unit 4, and then the pulsed laser beam emitted from the laser oscillator and adjusted in power by the attenuator is condensed by the condenser 10 and applied to the SiC ingot. A peeling layer decreased in strength is thereby formed within the SiC ingot.

As depicted in FIG. 1, the X-axis feeding mechanism 14 includes a ball screw 42 coupled to the X-axis movable plate 22 and extending in the X-axis direction and a motor 44 coupled to one end portion of the ball screw 42. The X-axis feeding mechanism 14 converts a rotary motion of the motor 44 into a rectilinear motion by the ball screw 42 and transmits the rectilinear motion to the X-axis movable plate 22, and thereby advances or retreats the X-axis movable plate 22 relative to the condenser 10 in the X-axis direction along guide rails 20a on the base 20.

The Y-axis feeding mechanism 16 includes a ball screw 46 coupled to the Y-axis movable plate 24 and extending in the Y-axis direction and a motor 48 coupled to one end portion of the ball screw 46. The Y-axis feeding mechanism 16 converts a rotary motion of the motor 48 into a rectilinear motion by the ball screw 46 and transmits the rectilinear motion to the Y-axis movable plate 24, and thereby advances or retreats the Y-axis movable plate 24 relative to the condenser 10 in the Y-axis direction along guide rails 22a on the X-axis movable plate 22.

The control unit 18 is electrically connected to the coordinate setting means 8. The X-coordinates and Y-coordinates of the boundary between the Facet region and the non-Facet region which coordinates are set by the coordinate setting means 8 are input to the control unit 18. The control unit 18 increases the energy of the laser beam and raises the position of the condenser 10 at a time of irradiating the Facet region with the laser beam with respect to the energy of the laser beam and the position of the condenser 10 at a time of irradiating the non-Facet region with the laser beam on the basis of the X-coordinates and Y-coordinates of the boundary between the Facet region and the non-Facet region. Incidentally, while the control unit 18 and the coordinate setting means 8 may be constituted by respective separate computers, the control unit 18 and the coordinate setting means 8 may be constituted by a single computer.

In the present embodiment, as depicted in FIG. 1, the laser processing apparatus 2 further includes: an imaging unit 50 that images the SiC ingot held by the holding unit 4; a display unit 52 that displays an image imaged by the imaging unit 50; a grinding unit 54 that grinds the top surface of the SiC ingot held by the holding unit 4; and a peeling mechanism 56 that peels off the wafer to be produced from the peeling layer of the SiC ingot held by the holding unit 4.

The imaging unit 50 is fitted to the undersurface of the end of the frame body 28, and is disposed between the case 30 of the fluorescence luminance detecting means 6 and the condenser 10 of the laser beam irradiating unit 12. In addition, the display unit 52 is disposed on the top surface of the frame body 28.

The grinding unit 54 includes: a casing 58 fitted to a side surface of the frame body 28 so as to be movable in the Y-axis direction; a casing moving mechanism 60 that moves the casing 58 in the Y-axis direction; an arm 62 extending in the Y-axis direction from a base end supported by the casing 58 so as to be raisable and lowerable; arm raising and lowering means (not depicted) for raising and lowering the arm 62; and a spindle housing 64 fitted to an end of the arm 62.

The spindle housing 64 rotatably supports a spindle 66 extending in the vertical direction, and includes a spindle motor (not depicted) that rotates the spindle 66. Making description with reference to FIG. 4, a disk-shaped wheel mount 68 is fixed to a lower end of the spindle 66, and an annular grinding wheel 72 is fixed by a bolt 70 to an undersurface of the wheel mount 68. A plurality of grinding stones 74 annularly arranged at intervals in a circumferential direction are fixed to an outer circumferential edge portion of an undersurface of the grinding wheel 72.

As depicted in FIG. 1, the peeling mechanism 56 includes: a casing 76 disposed at terminal portions of the guide rails 20a on the base 20; an arm 78 extending in the X-axis direction from a base end supported by the casing 76 so as to be raisable and lowerable; and arm raising and lowering means (not depicted) for raising and lowering the arm 78. A motor 80 is attached to an end of the arm 78. A suction piece 82 is coupled to an undersurface of the motor 80 so as to be rotatable about an axis extending in the vertical direction. A plurality of suction holes (not depicted) are formed in an undersurface of the suction piece 82. The suction piece 82 is connected to suction means (not depicted). In addition, the suction piece 82 includes ultrasonic vibration applying means (not depicted) for applying ultrasonic vibration to the undersurface of the suction piece 82.

Figure 5A:
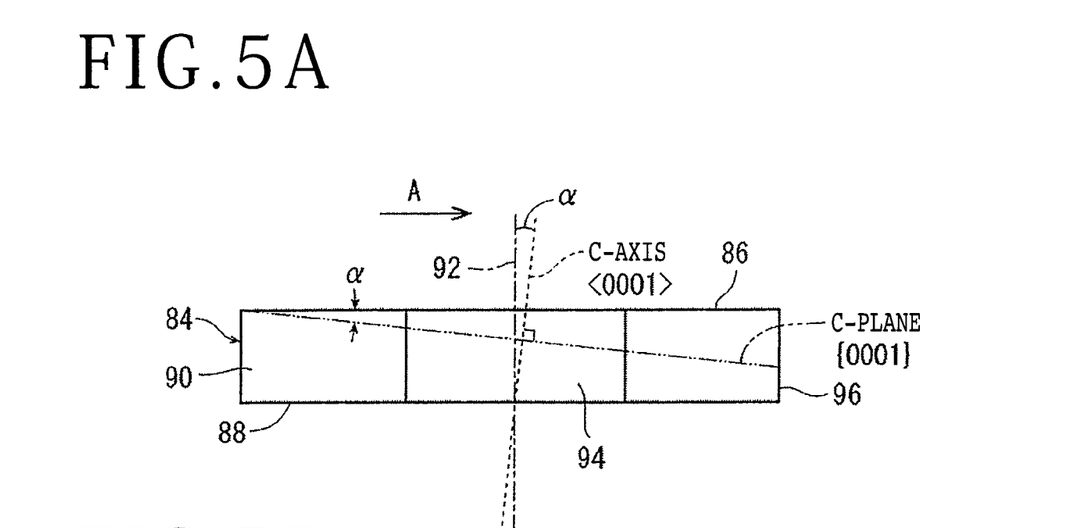
FIG. 5A is a front view of a SiC ingot.
Figure 5B:
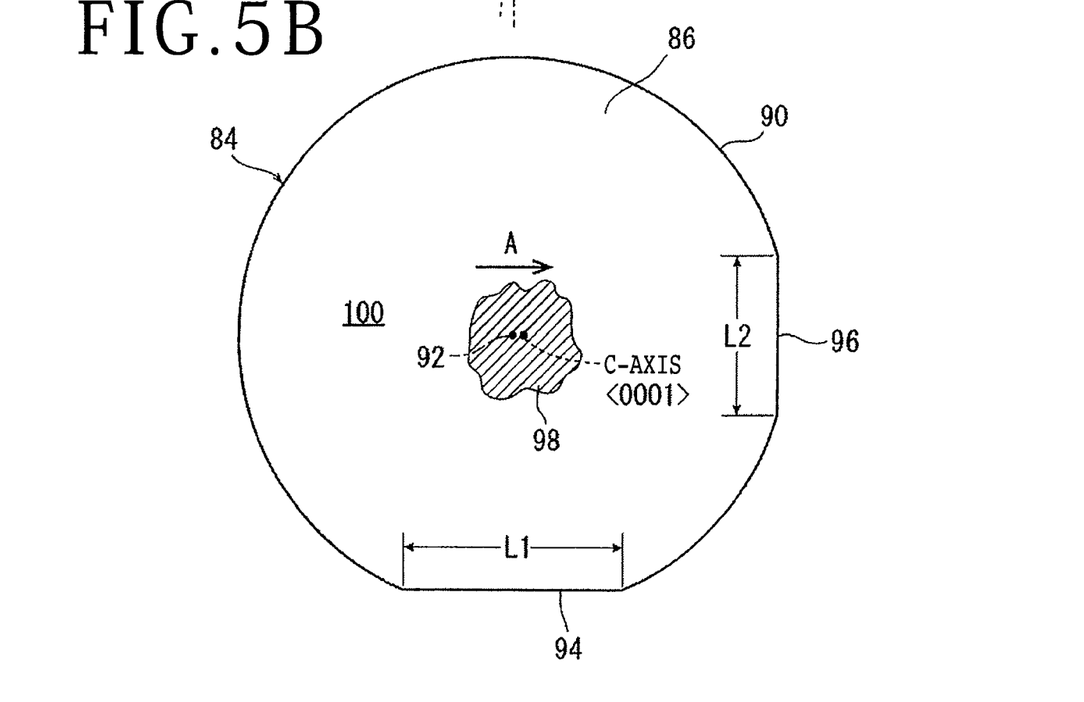
FIG. 5B is a plan view of the SiC ingot.

FIG. 5A and FIG. 5B show a SiC ingot 84 formed of SiC. The SiC ingot 84 as a whole is formed in a cylindrical shape. The SiC ingot 84 includes: a circular first end surface 86, a circular second end surface 88 on an opposite side from the first end surface 86; a peripheral surface 90 located between the first end surface 86 and the second end surface 88; a c-axis (<0001> direction) extending from the first end surface 86 to the second end surface 88; and a c-plane ({0001} plane) orthogonal to the c-axis.

In the SiC ingot 84, the c-axis is inclined with respect to a normal 92 to the first end surface 86, and an off angle α (for example, α=1, 3, 6 degrees) is formed between the c-plane and the first end surface 86. A direction in which the off angle α is formed is indicated by an arrow A in FIG. 5. In addition, a rectangular first orientation flat 94 and a rectangular second orientation flat 96 indicating a crystal orientation are formed on the peripheral surface 90 of the SiC ingot 84. The first orientation flat 94 is parallel with the direction A in which the off angle α is formed. The second orientation flat 96 is orthogonal to the direction A in which the off angle α is formed. As depicted in FIG. 5B, as viewed from above, a length L2 of the second orientation flat 96 is shorter than a length L1 of the first orientation flat 94 (L2<L1).

In addition, while the illustrated SiC ingot 84 is formed mainly of a hexagonal single crystal SiC, a Facet region 98 having a different crystal structure is locally present. The Facet region 98 is formed in a columnar shape from the first end surface 86 to the second end surface 88 of the SiC ingot 84, and is in a same shape in a thickness direction (vertical direction) of the SiC ingot 84 as in a Kintaro candy. Incidentally, a non-Facet region other than the Facet region 98 is indicated by reference numeral 100.

An embodiment of a wafer producing method according to the present invention will next be described. However, a wafer producing method using the above-described laser processing apparatus 2 will be described in the following. In the present embodiment, first, the SiC ingot 84 is fixed on the top surface of the holding table 26 via an appropriate adhesive (for example, an epoxy resin-based adhesive). Incidentally, a plurality of suction holes may be formed in the top surface of the holding table 26, and the SiC ingot 84 may be sucked and held by generating a suction force in the top surface of the holding table 26.

After the SiC ingot 84 is fixed on the holding table 26, a flat surface forming step is performed in which the top surface of the SiC ingot 84 is ground and formed into a flat surface, except for a case where a flat top surface of the SiC ingot 84 is already formed.

Figure 4:
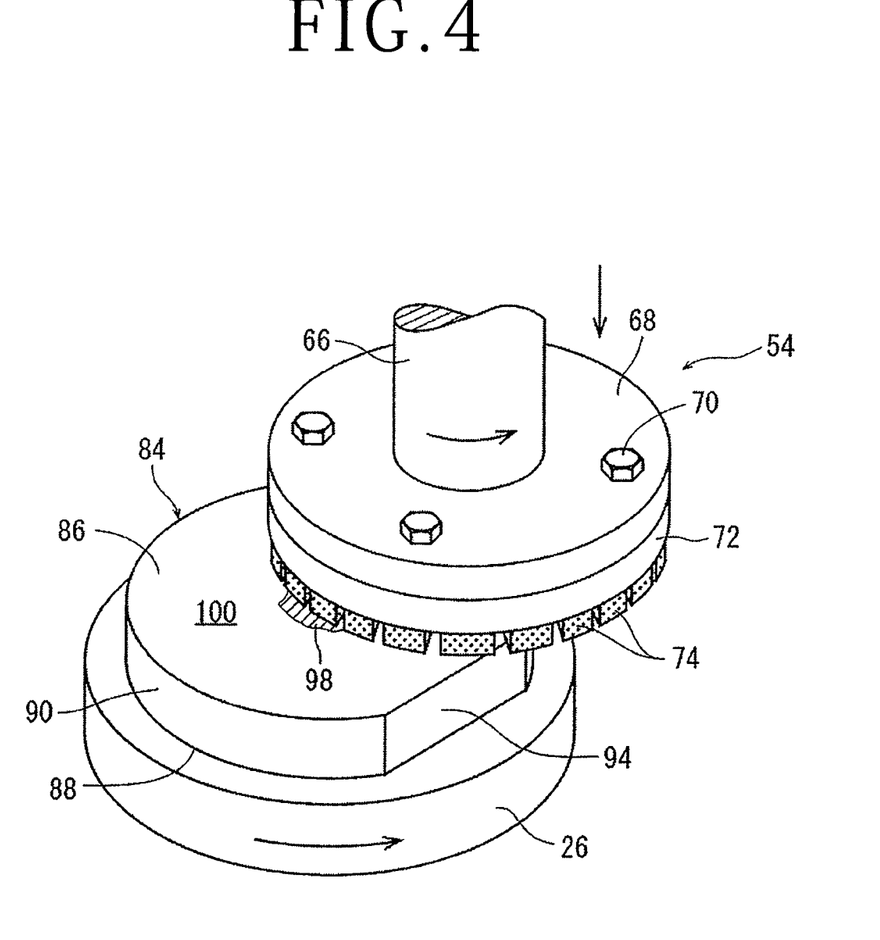
FIG. 4 is a perspective view depicting a state in which a flat surface forming step is being performed.

In the flat surface forming step, first, the holding table 26 is positioned below the grinding wheel 72 of the grinding unit 54. Next, as depicted in FIG. 4, the holding table 26 is rotated counterclockwise as viewed from above at a predetermined rotational speed (for example, 300 rpm). In addition, the spindle 66 is rotated counterclockwise as viewed from above at a predetermined rotational speed (for example, 6000 rpm). Next, the grinding stones 74 are brought into contact with the top surface of the SiC ingot 84 (first end surface 86 in the present embodiment) by lowering the arm 62 by the arm raising and lowering means. The arm 62 is thereafter lowered at a predetermined grinding feed speed (for example, 0.1 μm/s). Consequently, the top surface of the SiC ingot 84 can be ground and formed into such a flat surface as not to hinder the incidence of the laser beam.

After the flat surface forming step is performed, a fluorescence luminance detecting step is performed which detects fluorescence luminance unique to SiC by irradiating the SiC ingot 84 with the exciting light EL having the predetermined wavelength from the top surface of the SiC ingot 84.

Figure 6:
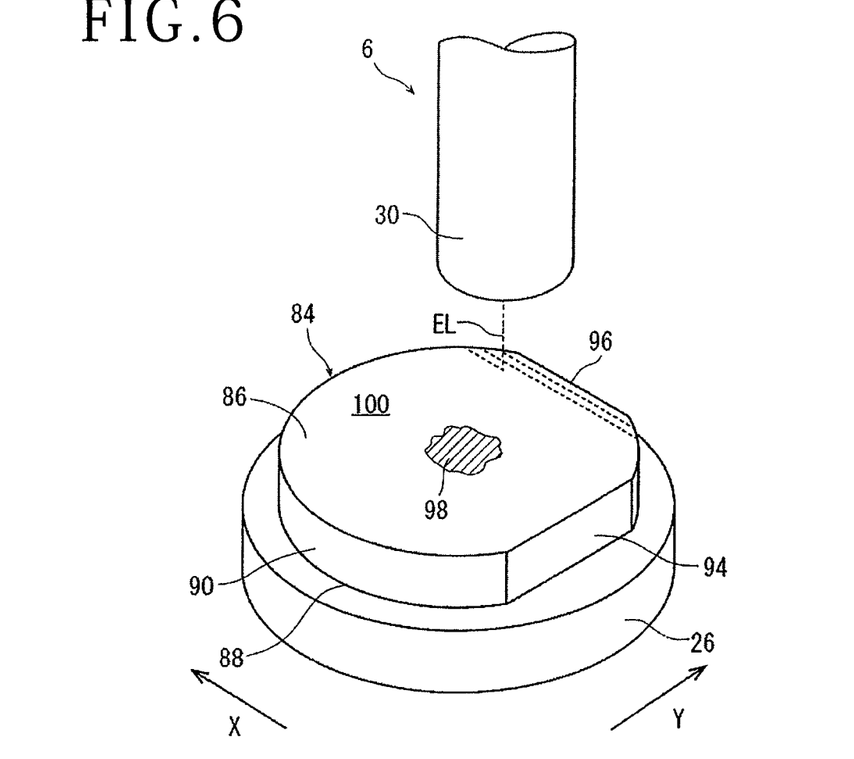
FIG. 6 is a perspective view depicting a state in which a fluorescence luminance detecting step is being performed.

In the fluorescence luminance detecting step, first, the holding table 26 is positioned below the imaging unit 50, and the imaging unit 50 images the SiC ingot 84 from the top surface thereof. Next, the orientation of the SiC ingot 84 is adjusted to a predetermined orientation and the positions in the XY plane of the SiC ingot 84 and the case 30 of the fluorescence luminance detecting means 6 are adjusted by moving and rotating the holding table 26 by the X-axis feeding mechanism 14, the Y-axis feeding mechanism 16, and the holding table motor on the basis of an image of the SiC ingot 84 imaged by the imaging unit 50. When the orientation of the SiC ingot 84 is adjusted to a predetermined orientation, a direction orthogonal to the direction A in which the off angle α is formed is aligned with the X-axis direction and the direction A in which the off angle α is formed is aligned with the Y-axis direction by aligning the second orientation flat 96 with the X-axis direction, as depicted in FIG. 6.

Next, the focusing point of the exciting light EL is positioned at an appropriate position (for example, the first end surface 86) of the SiC ingot 84 by raising or lowering the case 30 by the focusing point position adjusting means. Next, the SiC ingot 84 is irradiated with the exciting light EL having a low power (for example, 0.1 W) at such a level that laser processing is not performed on the SiC ingot 84, and having the predetermined wavelength (for example, 370 nm), while the X-axis feeding mechanism 14 moves the holding table 26 in the X-axis direction aligned with the direction orthogonal to the direction A in which the off angle α is formed. Then, as depicted in FIG. 2, fluorescence (radiated light) FL including a wavelength (for example, approximately 410 nm) different from the wavelength of the exciting light EL is emitted from the SiC ingot 84. The fluorescence FL passes through the condensing lens 36 and the dichroic mirror 34. Only the fluorescence FL in the second predetermined wavelength range (for example, 395 to 430 nm) thereafter passes through the band-pass filter 38. The luminance of the fluorescence FL passed through the band-pass filter 38 is detected by the photodetector 40.

Next, the SiC ingot 84 is indexing-fed relative to the focusing point of the exciting light EL in the Y-axis direction aligned with the direction A in which the off angle α is formed, by moving the holding table 26 by the Y-axis feeding mechanism 16. Then, the irradiation with the exciting light EL and the indexing feed are alternately repeated to detect, in association with an X-coordinate and a Y-coordinate, the luminance of the fluorescence FL in each of minute regions obtained by dividing the whole of the first end surface 86 of the SiC ingot 84 into meshes of an appropriate size in the X-axis direction and the Y-axis direction. Data on the luminance of the fluorescence FL detected by the photodetector 40 is sent to the coordinate setting means 8 in association with the X-coordinates and the Y-coordinates.

In such a fluorescence luminance detecting step, the coordinate setting means 8 performs a coordinate setting step of setting, as the X-axis, the direction orthogonal to the direction A in which the c-plane is inclined with respect to the top surface of the SiC ingot 84 (first end surface 86 in the present embodiment) and the off angle α is formed, setting the direction orthogonal to the X-axis as the Y-axis, setting, as the non-Facet region 100, a region in which the luminance of the fluorescence FL is equal to or higher than the predetermined value (for example, approximately 55 to 58

Figure 7A:
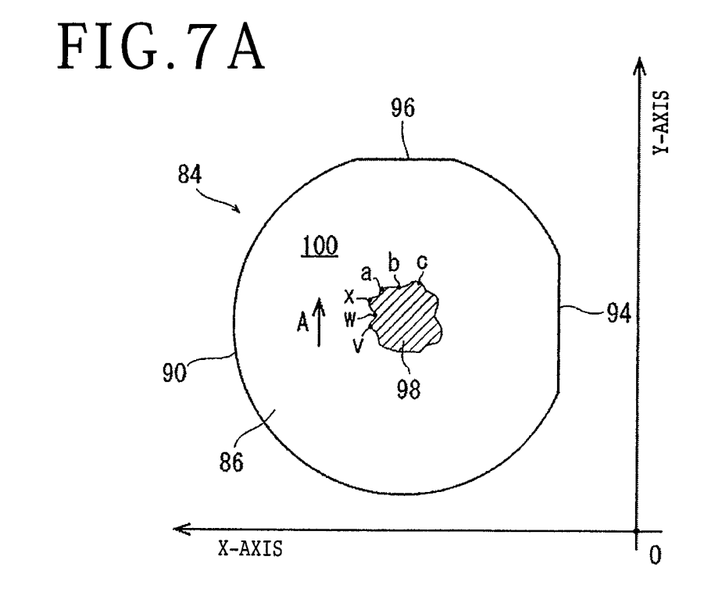
FIG. 7A is a schematic diagram of an image of the SiC ingot imaged in the fluorescence luminance detecting step.
Figure 7B:
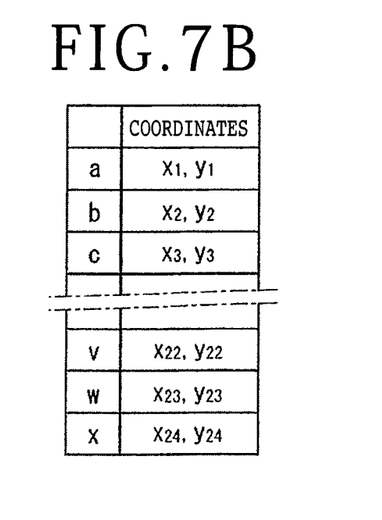
FIG. 7B is a table of X-coordinates and Y-coordinates of a boundary between the Facet region and the non-Facet region, the X-coordinates and Y-coordinates being set in a coordinate setting step.

A. U. in the case where the wavelength of the exciting light EL is 370 nm), setting a region in which the luminance of the fluorescence FL is lower than the predetermined value as the Facet region 98, and setting the X-coordinates and Y-coordinates of the boundary between the Facet region 98 and the non-Facet region 100. In the coordinate setting step in the present embodiment, the coordinate setting means 8 sets a plurality of X-coordinates and Y-coordinates (of 24 points from point a to point x, for example) of the boundary between the Facet region 98 and the non-Facet region 100, as depicted in FIG. 7, on the basis of the data on the luminance of the fluorescence FL which data is sent from the photodetector 40 of the fluorescence luminance detecting means 6. Data on the plurality of X-coordinates and Y-coordinates of the boundary between the Facet region 98 and the non-Facet region 100 which coordinates are set by the coordinate setting means 8 is sent to the control unit 18. Incidentally, the coordinate setting step may set the X-coordinates and Y-coordinates of the entire Facet region 98 and set the X-coordinates and Y-coordinates of the entire non-Facet region 100, and send the X-coordinates and Y-coordinates of the entire Facet region 98 and the X-coordinates and Y-coordinates of the entire non-Facet region 100 to the control unit 18.

After the coordinate setting step is performed, a processing feed step is performed which positions the focusing point formed by condensing the laser beam having the wavelength transmissible through SiC by the condenser 10 at a depth corresponding to the thickness of the wafer to be produced from the top surface of the SiC ingot 84, processing-feeds the SiC ingot 84 and the focusing point relative to each other in the X-axis direction while irradiating the SiC ingot 84 with the laser beam, and thereby forms a band-shaped peeling layer in which SiC is separated into Si and C and cracks extend along the c-plane.

Figure 8A:
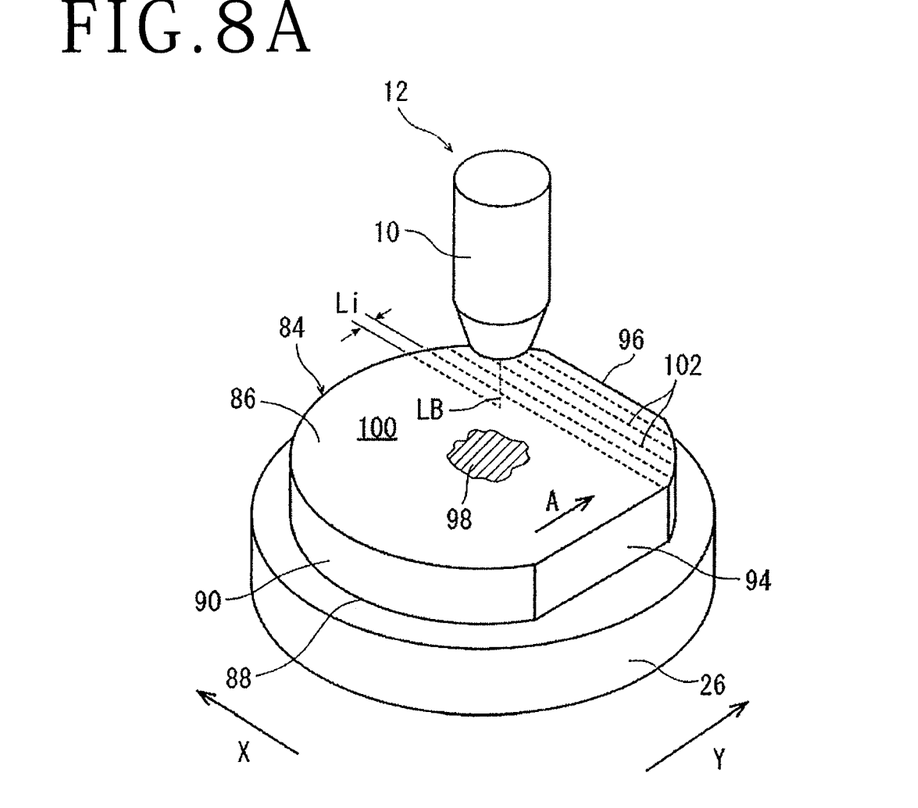
FIG. 8A is a perspective view depicting a state in which a processing feed step is being performed.
Figure 8B:
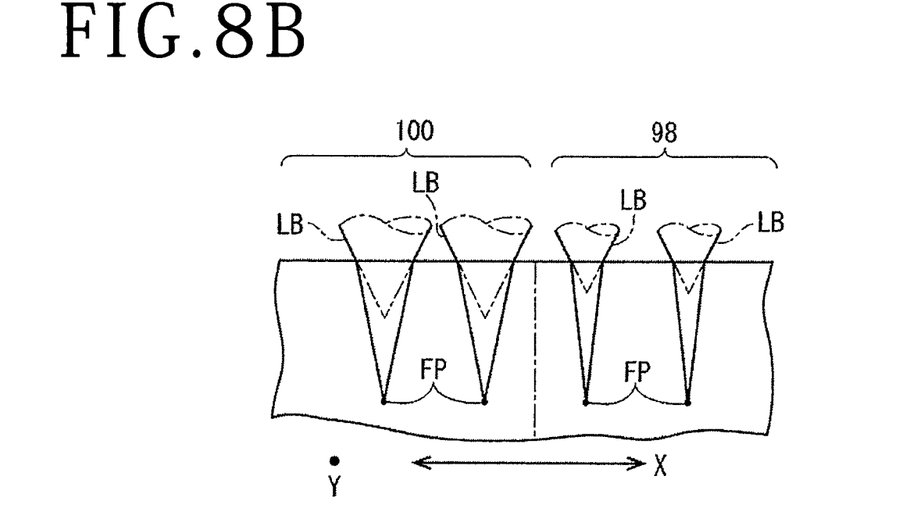
FIG. 8B is a sectional view depicting the state in which the processing feed step is being performed.
Figure 9:
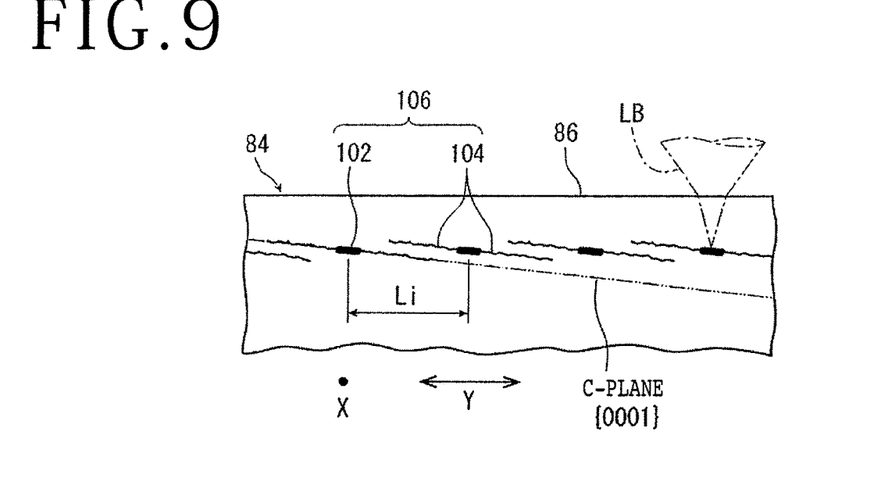
FIG. 9 is a sectional view depicting a peeling layer formed within the SiC ingot.

In the processing feed step, first, the positions in the XY plane of the SiC ingot 84 and the condenser 10 are adjusted by moving the holding table 26 in the X-axis direction and the Y-axis direction on the basis of the image of the SiC ingot 84 imaged by the imaging unit 50 in the fluorescence luminance detecting step. Next, the condenser 10 is raised or lowered by the focusing point position adjusting means to position the focusing point FP (see FIG. 8B) at the depth corresponding to the thickness of the wafer to be produced from the top surface of the SiC ingot 84 in the non-Facet region 100. Next, as depicted in FIG. 8A, the pulsed laser beam LB having the wavelength transmissible through SiC is applied from the condenser 10 to the SiC ingot 84 while the holding table 26 is moved at a predetermined feed speed in the X-axis direction aligned with the direction orthogonal to the direction A in which the off angle α is formed. Then, as depicted in FIG. 9, a band-shaped peeling layer 106 is formed along the X-axis direction in which peeling layer SiC is separated into Si (silicon) and C (carbon) by the application of the pulsed laser beam LB, the pulsed laser beam LB applied next is absorbed by C formed previously, and SiC is separated into Si and C in a chained manner, and also cracks 104 extend isotropically along the c-plane from a part 102 in which SiC is separated into Si and C.

In such a processing feed step, the control unit 18 controls the laser beam irradiating unit 12 so as to increase the energy of the pulsed laser beam LB and raise the position of the condenser 10 at a time of irradiating the Facet region 98 with the pulsed laser beam LB with respect to the energy of the pulsed laser beam LB and the position of the condenser 10 at a time of irradiating the non-Facet region 100 with the pulsed laser beam LB on the basis of the X-coordinates and Y-coordinates of the Facet region 98 and the non-Facet region 100 which coordinates are set in the coordinate setting step. The index of refraction of the Facet region 98 is higher than the index of refraction of the non-Facet region 100. However, by performing control as described above, it is possible to make the depth of the focusing point FP substantially the same in the Facet region 98 and the non-Facet region 100, and make the depth of the peeling layer 106 formed in the Facet region 98 and the non-Facet region 100 substantially uniform, as depicted in FIG. 8B. In addition, the Facet region 98 has a higher energy absorption rate than the non-Facet region 100. However, finished quality of the peeling layer 106 formed in the Facet region 98 and the non-Facet region 100 can be made uniform by increasing the energy of the pulsed laser beam LB applied to the Facet region 98 as compared with the energy of the pulsed laser beam LB applied to the non-Facet region 100.

Such a processing feed step can be performed under the following processing conditions, for example. Incidentally, defocus in the following is an amount of movement when the condenser 10 is moved toward the top surface of the SiC ingot 84 from a state in which the focusing point FP of the pulsed laser beam LB is positioned at the top surface of the SiC ingot 84.

(Non-Facet region: an index of refraction of 2.65)
Wavelength of the pulsed laser beam: 1064 nm
    Average power: 7 W
    Repetition frequency: 30 kHz
    Pulse width: 3 ns
    Feed speed: 165 mm/s
    Defocus: 188 μm
    Position of the peeling layer from the top surface of the SiC ingot: 500 μm
(Facet region: an index of refraction of 2.79)
    Wavelength of the pulsed laser beam: 1064 nm
    Average power: 9.1 W
    Repetition frequency: 30 kHz
    Pulse width: 3 ns
    Feed speed: 165 mm/s
    Defocus: 179 μm
    Position of the peeling layer from the top surface of the SiC ingot: 500 μm In addition, an indexing feed step is performed which arranges band-shaped peeling layers 106 in the Y-axis direction in parallel with each other by indexing-feeding the SiC ingot 84 and the focusing point FP relative to each other in the Y-axis direction. In the present embodiment, the above-described processing feed step is repeated while the SiC ingot 84 is indexing-fed relative to the focusing point FP in the Y-axis direction by a predetermined indexing feed amount Li (see FIG. 8A and FIG. 9). Consequently, band-shaped peeling layers 106 extending in the X-axis direction can be arranged in the Y-axis direction in parallel with each other within the SiC ingot 84. In addition, the peeling off of the wafer in the following peeling step is facilitated by setting the indexing feed amount Li in a range not exceeding the width of the cracks 104, and making the cracks 104 of peeling layers 106 adjacent to each other in the Y-axis direction overlap each other as viewed in the vertical direction.

Figure 10:
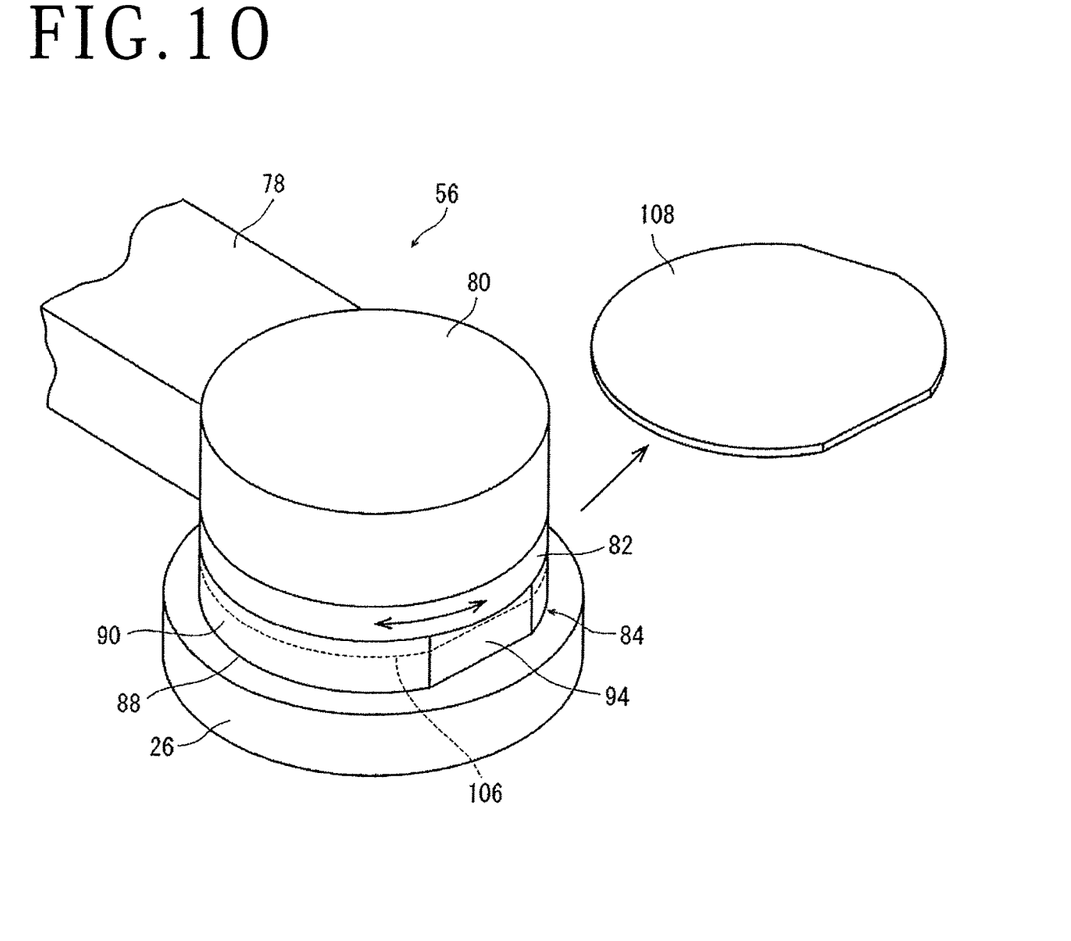
FIG. 10 is a perspective view depicting a state in which a peeling step is being performed.

After a plurality of band-shaped peeling layers 106 are formed in the SiC ingot 84 by performing the processing feed step and the indexing feed step, a peeling step is performed which peels off the wafer to be produced from the peeling layer 106. In the peeling step, first, the holding table 26 is moved to a position below the suction piece 82 of the peeling mechanism 56. Next, the arm 78 is lowered by the arm raising and lowering means to bring the undersurface of the suction piece 82 into close contact with the first end surface 86 of the SiC ingot 84, as depicted in FIG. 10. Next, the undersurface of the suction piece 82 is stuck to the first end surface 86 of the SiC ingot 84 by actuating the suction means. Next, ultrasonic vibration is applied to the undersurface of the suction piece 82 by actuating the ultrasonic vibration applying means, and the suction piece 82 is rotated by the motor 80. A SiC wafer 108 to be produced can be thereby peeled off from the peeling layer 106.

In addition, by flattening a peeling surface by subjecting the SiC ingot 84 from which the SiC wafer 108 is peeled off to the above-described flat surface forming step, and thereafter repeating the processing feed step, the indexing feed step, and the peeling step, it is possible to produce a plurality of SiC wafers 108 from the SiC ingot 84. As for the fluorescence luminance detecting step and the coordinate setting step, because the Facet region 98 is formed in a columnar shape from the top surface to the undersurface of the SiC ingot 84 and has a same shape as in a Kintaro candy in the thickness direction, it suffices to perform the fluorescence luminance detecting step and the coordinate setting step when the first SiC wafer 108 is produced from the SiC ingot 84, and the fluorescence luminance detecting step and the coordinate setting step do not have to be performed when a second and subsequent SiC wafers 108 are produced.

As described above, in the present embodiment, the position and finished quality of the peeling layers 106 formed in the Facet region 98 and the non-Facet region 100 can be made uniform. It is therefore possible to produce the SiC wafer 108 without a level difference between the Facet region 98 and the non-Facet region 100. Hence, it is not necessary to allow for the level difference between the Facet region 98 and the non-Facet region 100 and peel off a thick SiC wafer 108. An improvement in efficiency can therefore be achieved.

Incidentally, while description has been made of an example in which the fluorescence luminance detecting means 6 and the coordinate setting means 8 are incorporated in the laser processing apparatus 2 in the foregoing present embodiment, the fluorescence luminance detecting means 6 and the coordinate setting means 8 may not be incorporated in the laser processing apparatus 2. That is, the fluorescence luminance detecting means 6 and the coordinate setting means 8 may be constituent elements of a Facet region detecting apparatus including at least the fluorescence luminance detecting means 6 and the coordinate setting means 8. Then, using the Facet region detecting apparatus including at least the fluorescence luminance detecting means 6 and the coordinate setting means 8, a Facet region detecting method including at least the fluorescence luminance detecting step and the coordinate setting step described above may be performed. It is thereby possible to detect the Facet region 98 and the non-Facet region 100 of the SiC ingot 84. Thus, on the basis of data on the detected Facet region 98 and the detected non-Facet region 100, processing conditions for irradiating the SiC ingot 84 with the pulsed laser beam LB can be controlled appropriately, so that the SiC wafer 108 without a level difference between the Facet region 98 and the non-Facet region 100 can be produced.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of detecting a Facet region of a SiC ingot, the method comprising:
a fluorescence luminance detecting step of detecting fluorescence luminance unique to SiC by irradiating the SiC ingot with exciting light having a predetermined wavelength from a top surface of the SiC ingot; and
a coordinate setting step of setting a region in which the fluorescence luminance is equal to or higher than a predetermined value in the fluorescence luminance detecting step as a non-Facet region, setting a region in which the fluorescence luminance is lower than the predetermined value in the fluorescence luminance detecting step as a Facet region, and setting coordinates of a boundary between the Facet region and the non-Facet region.

2. A wafer producing method for producing a SiC wafer from a SiC ingot, the wafer producing method comprising:
a flat surface forming step of forming a top surface of the SiC ingot into a flat surface by grinding the top surface of the SiC ingot;
a fluorescence luminance detecting step of detecting fluorescence luminance unique to SiC by irradiating the SiC ingot with exciting light having a predetermined wavelength from the top surface of the SiC ingot;
a coordinate setting step of setting, as an X-axis, a direction orthogonal to a direction in which a c-plane is inclined with respect to the top surface of the SiC ingot and an off angle is formed, setting a direction orthogonal to the X-axis as a Y-axis, setting a region in which the fluorescence luminance is equal to or higher than a predetermined value in the fluorescence luminance detecting step as a non-Facet region, setting a region in which the fluorescence luminance is lower than the predetermined value in the fluorescence luminance detecting step as a Facet region, and setting X-coordinates and Y-coordinates of a boundary between the Facet region and the non-Facet region;
a processing feed step of forming a band-shaped peeling layer in which SiC is separated into Si and C and a crack extends along the c-plane, by positioning a focusing point formed by condensing a laser beam having a wavelength transmissible through SiC by a condenser at a depth corresponding to thickness of a wafer to be produced from the top surface of the SiC ingot, and processing-feeding the SiC ingot and the focusing point relative to each other in an X-axis direction while irradiating the SiC ingot with the laser beam;
an indexing feed step of arranging band-shaped peeling layers in a Y-axis direction in parallel with each other by indexing-feeding the SiC ingot and the focusing point relative to each other in the Y-axis direction; and
a peeling step of peeling off the wafer to be produced from the peeling layers;
the processing feed step increasing energy of the laser beam and raising a position of the condenser at a time of irradiating the Facet region with the laser beam with respect to the energy of the laser beam and the position of the condenser at a time of irradiating the non-Facet region with the laser beam on a basis of the X-coordinates and the Y-coordinates of the boundary between the Facet region and the non-Facet region, the X-coordinates and the Y-coordinates being set in the coordinate setting step.

* * * * *